United States Patent
Le et al.

(10) Patent No.: US 7,877,655 B2
(45) Date of Patent: Jan. 25, 2011

(54) METHOD FOR PERFORMING A TEST CASE WITH A LBIST ENGINE ON AN INTEGRATED CIRCUIT, INTEGRATED CIRCUIT AND METHOD FOR SPECIFYING AN INTEGRATED CIRCUIT

(75) Inventors: Thuyen Le, Taufkirchen (DE); Thomas Pflueger, Leinfelden (DE); Martin Padeffke, Hildrizhausen (DE); Stefan Bonsels, Stuttgart (DE)

(73) Assignee: International Business Machines Corporation, Armonk, NY (US)

( * ) Notice: Subject to any disclaimer, the term of this patent is extended or adjusted under 35 U.S.C. 154(b) by 527 days.

(21) Appl. No.: 11/855,505

(22) Filed: Sep. 14, 2007

(65) Prior Publication Data

US 2008/0072111 A1 Mar. 20, 2008

(30) Foreign Application Priority Data

Sep. 14, 2006 (EP) .................................. 06120612

(51) Int. Cl.
*G01R 31/28* (2006.01)
(52) U.S. Cl. ...................................... 714/729; 714/739
(58) Field of Classification Search ................. 714/726, 714/733, 729, 724, 731, 727, 732, 738, 736, 714/734
See application file for complete search history.

(56) References Cited

U.S. PATENT DOCUMENTS

| | | | |
|---|---|---|---|
| 6,021,514 A * | 2/2000 | Koprowski | 714/733 |
| 6,327,685 B1 | 12/2001 | Koprowski et al. | |
| 6,516,432 B1 * | 2/2003 | Motika et al. | 714/732 |
| 6,671,838 B1 | 12/2003 | Koprowski et al. | |
| 6,751,765 B1 * | 6/2004 | Rizzolo et al. | 714/732 |
| 6,934,921 B1 * | 8/2005 | Gu et al. | 716/6 |
| 7,272,764 B2 * | 9/2007 | Rich et al. | 714/733 |
| 2002/0125907 A1 * | 9/2002 | Kurtulik et al. | 324/765 |
| 2007/0220383 A1 * | 9/2007 | Kiryu | 714/726 |
| 2007/0245195 A1 * | 10/2007 | Rich et al. | 714/733 |

OTHER PUBLICATIONS

Thomas G. Foote et al, Testing the 500-MHz IBM S/390 Microprocessor, IEEE, Jul.-Sep. 1998, pp. 83-89.

* cited by examiner

*Primary Examiner*—Jeffrey A Gaffin
*Assistant Examiner*—Daniel F McMahon
(74) *Attorney, Agent, or Firm*—H. Daniel Schnurmann

(57) ABSTRACT

A method for performing a test case with at least one LBIST engine on an integrated circuit with a plurality of storage elements and logic circuits interconnected according to a predetermined scheme. The LBIST engine is partially built up by storage elements and/or logic circuits. At least one scan chain is formed as a series of selected storage elements and the other storage elements are used for the LBIST engine or a part of said LBIST engine in a testing mode. The scan chain is driven by a test pattern and the LBIST test case is testing those parts of the logic circuits corresponding to the storage elements of said scan chain.

16 Claims, 5 Drawing Sheets

METHOD FOR PERFORMING A TEST CASE WITH A LBIST ENGINE ON AN INTEGRATED CIRCUIT, INTEGRATED CIRCUIT AND METHOD FOR SPECIFYING AN INTEGRATED CIRCUIT

A method for performing a test case with a LBIST engine on an integrated circuit, integrated circuit and method for specifying an integrated circuit

BACKGROUND OF THE INVENTION

The present invention relates to a method for performing a test case with at least one logic built-in-self-test (LBIST) engine on an integrated circuit. Further the present invention relates to an integrated circuit with a plurality of storage elements and/or logic circuits and at least one LBIST engine. In addition the present invention relates to a method for specifying an according integrated circuit with a LBIST engine.

Integrated semiconductor circuits include a plurality of storage elements and logic circuits. During the production the integrated circuits have to be tested in order to detect defects on the integrated circuit. An example of such a method is the level sensitive scan design (LSSD) test. Thereby a LSSD tester generates test patterns, which are scanned into scan chains formed by the storage elements. In another example built-in-self-test (BIST) engines or logic built-in-self-test (LBIST) engines form a part of the integrated circuit.

For the LBIST engine the integrated circuit has to provide a pseudo-random pattern generator (PRPG), a multiple input signature register (MISR), masking and weighting storage elements and a glue logic. The PRPG generates random patterns. Said random patterns are driven into the scan chains. The scan chain is formed by a plurality of storage elements. The results from the scan chains are serially compressed into the MISR. The length of the scan chain determines the time for the test case.

FIG. 4 illustrates a schematic diagram of a part of an integrated circuit under test with scan chains according to the prior art. The integrated circuit comprises a plurality of storage elements 10 and 12. In this example the storage elements 10 and 12 are of master-slave-types and include two flip-flop elements L1 and L2. The storage element 10 and 12 comprise a data output DO, a scan input SI, a scan output SO, at least one scan clock input SC and a mixed clock input MC. Additionally the storage element 10 comprises a data input DI and a functional clock input FC. The storage elements 10 are scan-able storage elements. The storage elements 12 are so-called scan-only storage elements. Said scan-only storage elements are used to store constant information necessary for the functionality of the system.

In a non-functional mode for testing and scanning purposes all storage elements 10 and 12 are connected serially to a scan chain 20 via their scan inputs SI and scan outputs SO.

Further the integrated circuit includes logic circuits 14. The input ports of the logic circuit 14 are connected to the data outputs DO of several storage elements 10 and 12. The output port of the logic circuit 14 is connected with one or more data inputs DI of another storage elements 10 and 12.

In a functional mode the functional clock inputs FC are running to clock the scan-able storage elements 10. In the non-functional mode the scan clock inputs SC are used to shift data through the storage elements 10 and 12 in the scan chain 20. The scan data is captured at the scan input SI and delivered to the scan output SO.

FIG. 5 illustrates a functional diagram of the integrated circuit with the LBIST engine according to the prior art. The integrated circuit includes a pseudo-random pattern generator (PRPG) 22, weighting storage elements 24, a weighting and phaseshift logic 26, N scan chains 28, masking storage elements 32, a masking logic 34 and a multiple input signature register (MISR) 36. Between the scan chains 28 are logic circuits 30. The scan chains 28 are formed by storage elements. The output of the storage elements in the scan chains 28 feed the logic circuits 30.

In this example the logic circuit 30 between the scan chain (0) and the scan chain (1) is fed by the storage elements in scan chain (0). The outputs of this logic circuit 30 are captured by the scan chain (1). For simplicity reasons the inputs of scan chain (0) and the outputs of scan chain (1) are not shown in FIG. 5. In reality the wiring connections between the scan chains 28 and the logic circuits 30 depend solely on the assignment of the storage elements to scan chains 28 and logic gates to logic circuits 30.

The PRPG 22 generates random patterns to be driven into the scan chains 28. The results from the scan chains 28 are serially compressed into the MISR 36 and read out after completion.

In the state of the art described above additional circuits are required for the LBIST engines on the integrated circuit. In the normal operation, i.e. in the functional mode, of the integrated circuit the LBIST engines remain idle. For example a typical integrated circuit has several LBIST engines. Every LBIST engine requires a lot of storage elements. The number of the storage elements depends on a predetermined test time.

It is an object of the present invention to provide an improved method and an according improved integrated circuit for performing LBIST test cases.

SUMMARY OF THE INVENTION

The above object is achieved by a method as laid out in the independent claims. Further advantageous embodiments of the present invention are described in the dependent claims and are taught in the description below.

The core idea of the invention is the use of available functional circuits on the integrated circuit for the LBIST test engine. A selection of storage elements and logic circuits, which are normally used in a functional mode, are used as the LBIST engine or parts thereof in a testing mode.

The invention has the advantage that the LBIST area is reduced. The saved area can be used for additional LBIST engines. Those storage elements and logic circuits forming a part of the LBIST engine may be reused for the functional system again.

BRIEF DESCRIPTION OF THE SEVERAL VIEWS OF THE DRAWINGS

The above as well as additional objectives, features and advantages of the present invention will be apparent in the following detailed written description.

The novel and inventive features believed characteristics of the invention are set forth in the appended claims. The invention itself, their preferred embodiments and advantages thereof will be best understood by reference to the following detailed description of preferred embodiments in conjunction with the accompanied drawings, wherein:

DETAILED DESCRIPTION OF THE INVENTION

Figure 1:
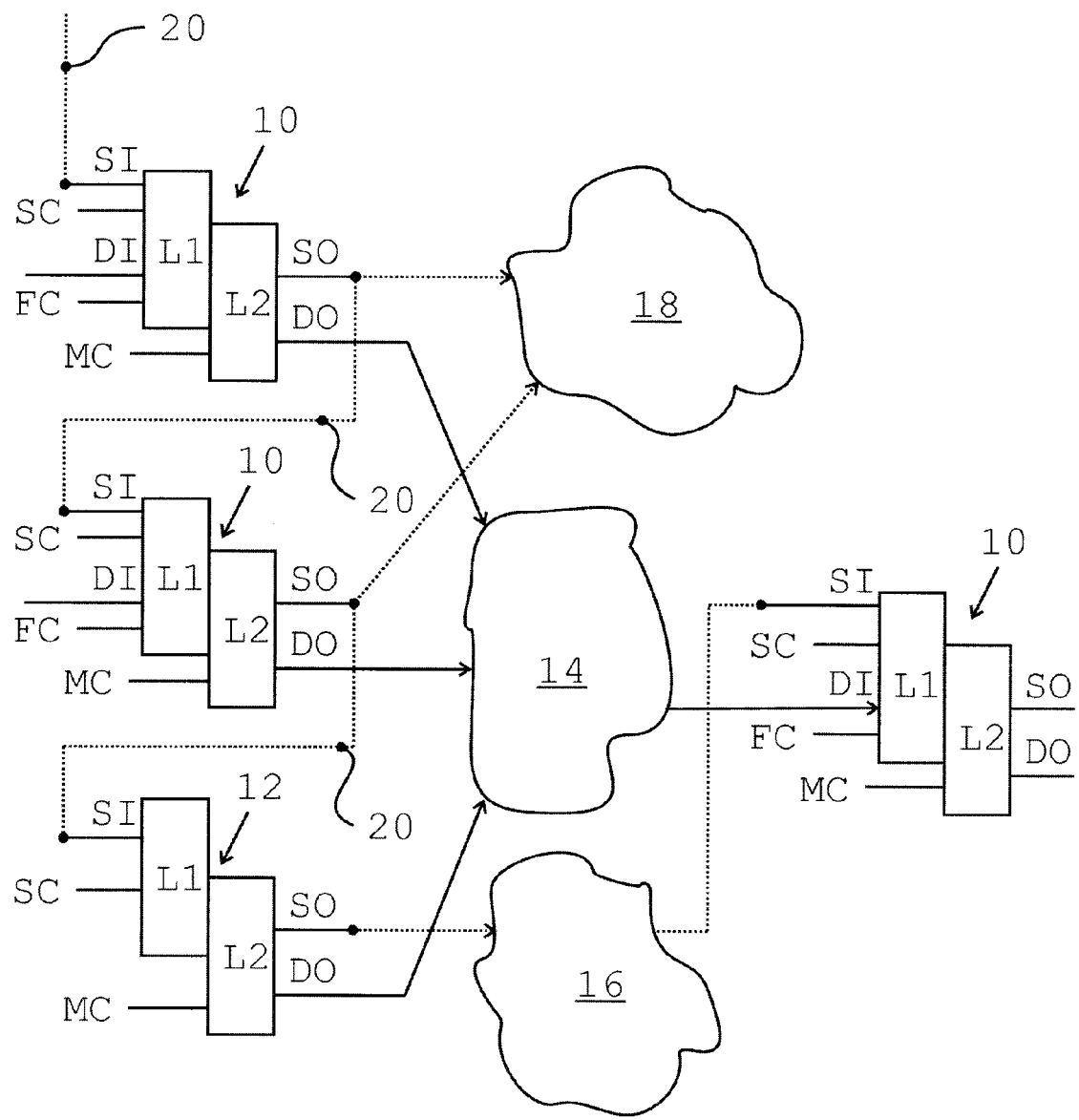
FIG. 1 illustrates a schematic diagram of an integrated circuit with a logic built-in-self-test engine modified according to a preferred embodiment of the present invention.

FIG. 1 illustrates a schematic diagram of a part of an integrated circuit with a logic built-in-self-test (LBIST) engine, which is modified according to the present invention. The integrated circuit comprises a plurality of storage elements 10 and 12. Each storage element 10 and 12 represents a one-bit-state. In this example each storage element 10 and 12 is of a master-slave-type with two flip-flop elements L1 and L2.

Each storage element 10 and 12 includes a scan input SI, a scan output SO, a data output DO, a scan clock input SC and a mixed clock input MC. Additionally the storage elements 10 include a data input DI and a functional clock input FC. The scan clock input SC and the functional clock input FC are inputs of the flip-flop element L1. The mixed clock input MC is an input of the flip-flop element L2. The storage elements 10 are scan-able storage elements. The storage elements 12 are so-called scan-only storage elements. Said scan-only storage elements are used to store constant information necessary for the functionality of the system.

In a functional mode the functional clock input FC and the mixed clock input MC are provided with clock signals. The clock signal on the mixed clock input MC and the clock signal on the functional clock input FC are inverted. In a testing mode the scan clock input SC and the mixed clock input MC are provided with clock signals. The clock signal on the mixed clock input MC and the clock signal on the scan clock input SC are also inverted.

The scan output SO of the storage element 10 or 12 is connected to the scan input SI of the next storage element 10 or 12. In this way all the storage elements 10 and 12 are serially connected to a scan chain 20. The scan chain 20 and their storage elements 10 and 12 form a shift register.

The integrated circuit comprises further a plurality of functional logic circuits 14. One of said functional logic circuit 14 is shown in FIG. 1. The input ports of the functional logic circuit 14 are connected to the data outputs DO of several storage elements 10 and 12. The output port of the functional logic circuit 14 is connected to the data input DI of another storage element 10. The state of the output port of the functional logic circuit 14 depends on the states of the input ports of said functional logic circuit 14. The behavior of the functional logic circuit 14 may be represented by a truth table, for example. In the functional mode the functional logic circuit 14 is used for the normal operation. In the testing mode the functional logic circuit 14 is tested.

The integrated circuit comprises a plurality of LBIST logic circuits 16 and 18. The LBIST logic circuit 16 is interconnected to the scan chain 20 and form a part of said scan chain 20. The input port of the LBIST logic circuit 16 is connected to the scan output SO of one of the storage element 12. The output port of the LBIST logic circuit 16 is connected to the scan input SI of one of the storage elements 10. The input port of the LBIST logic circuit 18 is connected to one or several scan outputs SO of the storage element 10. The LBIST logic circuit 18 is driven by the scan outputs SO. The output ports of the LBIST logic circuit 18 are used as LBIST related outputs.

Since the scan path is orthogonal to the system path, the proposed method may be implemented without modifying or changing the system functionality of the reused circuit. The elements of the LBIST logic circuits 16 and 18 are originally provided only as logic circuits for the functional mode. According to the invention the LBIST logic circuits 16 and 18 are a part of the LBIST engine during the testing mode. In the functional mode the LBIST logic circuits 16 and 18 are additionally used as logic circuits for the normal operation.

In the testing mode the storage elements 10 and 12 are connected serially to the scan chain 20 via its scan inputs SI and scan outputs SO.

In a functional mode the functional clock inputs FC are running to clock the flip-flop L1 of the scan-able storage elements 10. In the non-functional mode the scan clock inputs SC are used to shift data through the flip-flop L1 of the storage elements 10 and 12 in the scan chain 20. The scan data is captured at the scan input SI and delivered to the scan output SO. The mixed clock MC is used to capture the output of the flip-flop L1 into the input of the flip-flop L2.

Figure 4:
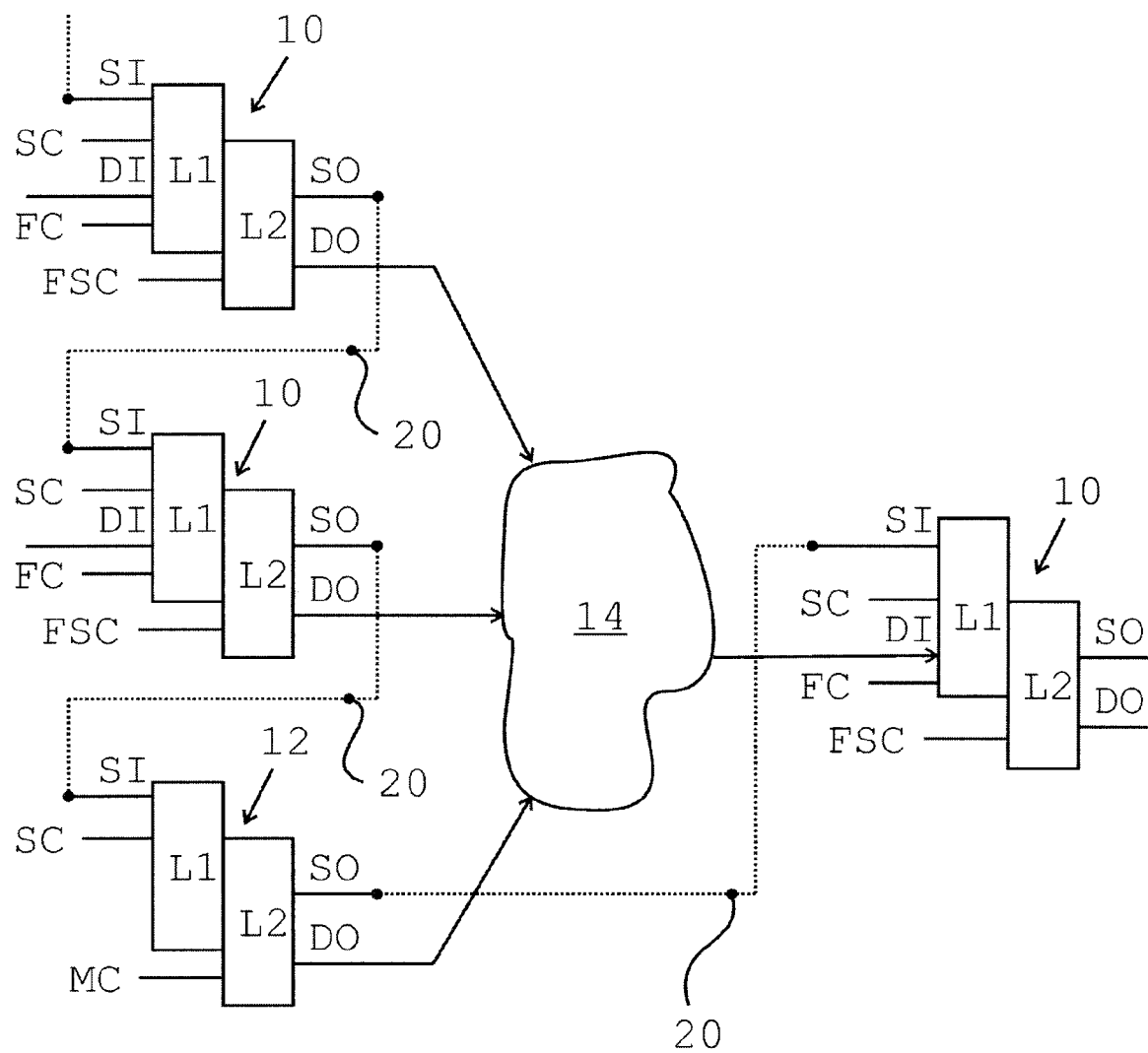
FIG. 4 illustrates a schematic diagram of a part of an integrated circuit under test with scan chains according to the prior art.

FIG. 4 illustrates a schematic diagram of a part of an integrated circuit according to the prior art. This known integrated circuit comprises the same components as the integrated circuit according to the present invention in FIG. 1, except the LBIST logic circuit 16 and the LBIST logic circuit 18. Therefore the scan chain 20 is formed only by the storage elements 10 and 12.

The comparison of FIG. 1 and FIG. 4 demonstrates the difference between the present invention and the prior art. In the prior art a complete LBIST engine is additionally on the chip of the integrated circuit. Said LBIST engine is only used for the LBIST test case.

The integrated circuit according to the present invention comprises the LBIST logic circuits 16 and 18, which are used as a part of the test engine in the testing mode and as a normal logic circuit in the functional mode. The LBIST logic circuit 16 forms a part of the scan chain 20. The LBIST logic circuit 16 may be used as the PRPG 22, for example.

The LBIST logic circuit 18 is driven by the scan outputs SO. The outputs of the LBIST logic circuit 18 may feed the scan chains 20, for example.

The LBIST logic circuit 16 and the LBIST logic circuit 18 are built up with storage elements and logical circuits. At least a part of these storage elements and logical circuits is provided for the functional mode and therefore already available on the chip.

Figure 2:
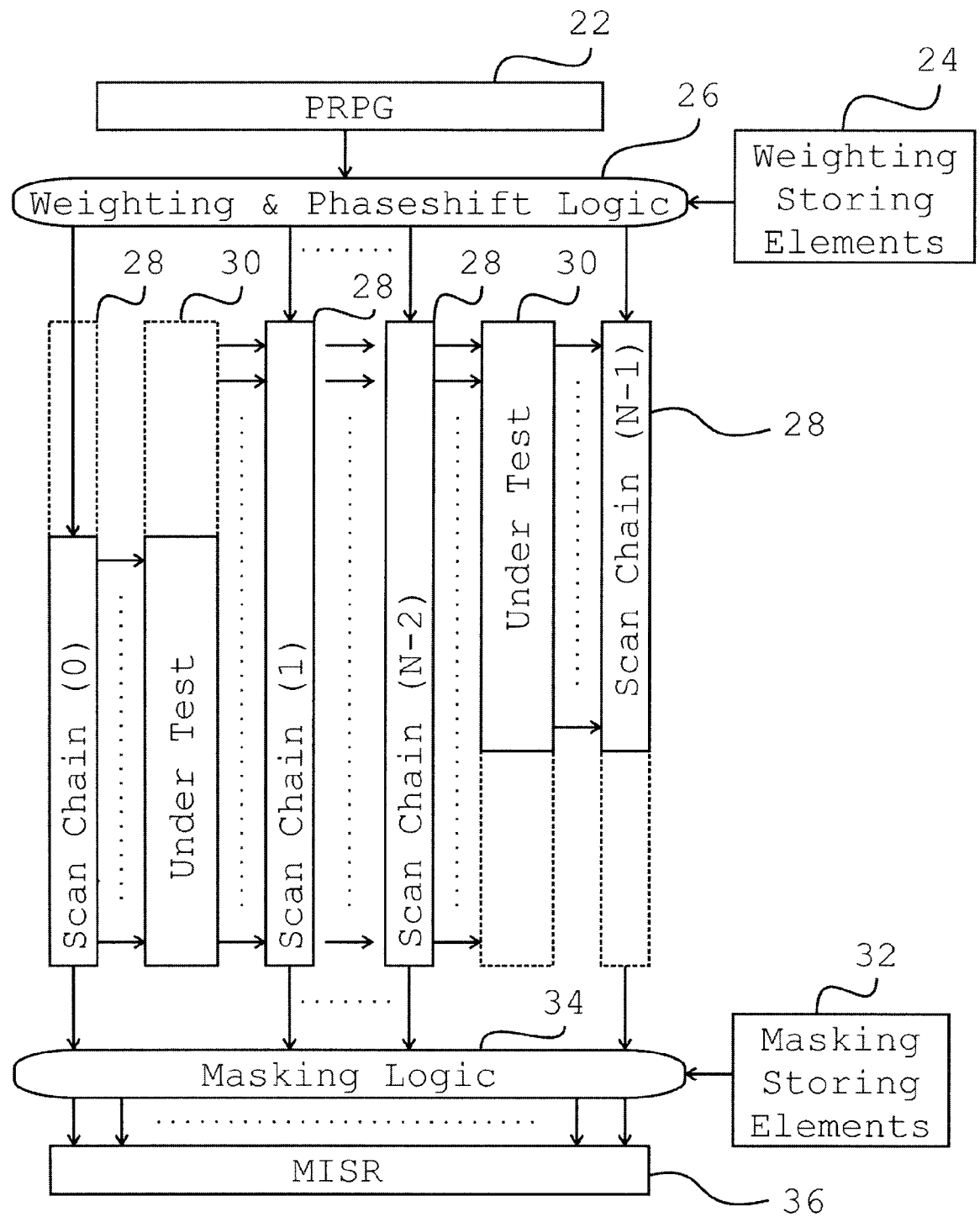
FIG. 2 illustrates a functional diagram of a logic built-in-self-test engine according to the preferred embodiment of the present invention.

FIG. 2 illustrates a diagram of an integrated circuit with the LBIST engine according to the preferred embodiment of the present invention. The integrated circuit includes a pseudo-random pattern (PRPG) 22, weighting storage elements 24, a weighting and phaseshift logic 26, N scan chains 28, masking storage elements 32, a masking logic 34 and a multiple input signature register (MISR) 36. Between the scan chains 28 are logic circuits 30 corresponding to the scan chains 28 beneath. The scan chains 28 are formed by storage elements. The output of the storage elements in the scan chains 28 feed the logic circuits 30.

The PRPG 22 is a linear feedback shift register (LFSR). The PRPG 22 generates random patterns to be driven into that part of the scan chains 28, represented by solid lines. The results from that part of the scan chains 28 are serially compressed into the MISR 36 and read out after completion.

The weighting storage elements 24 are built up by storage elements available on the chip. Said storage elements also used on the functional mode. The weighting storage elements 24 contain information about the probability of the two logical states 0 and 1 within the random pattern.

The weighting and phaseshift logic 26 is built up by logic circuits available on the chip. The weighting and phaseshift logic 26 provides a phaseshift of the random pattern. Said phaseshift may be performed by XOR gates, for example. Further the weighting and phaseshift logic 26 acts on the random pattern according to the weighting criteria in the weighting storage elements 24. This may be performed by AND gates, for example.

The masking storage elements 32 are built up by storage elements available on the chip. Said masking storage elements 32 contain the information about the selection criteria. The masking logic 34 is built up by logic circuits available on the chip. For example, said logic circuit comprises a plurality of AND gates.

In this example the logic circuit 30 between the scan chain (0) and the scan chain (1) is fed by the storage elements in scan chain (0) and its outputs are captured by the scan chain (1). For simplicity reasons the inputs of scan chain (0) and the outputs of scan chain (1) are not shown in FIG. 2. In reality the wiring connections between the scan chains 28 and the logic circuits 30 depends solely on the assignment of the storage elements to scan chains 28 and logic gates to logic circuits 30.

The storage elements in those parts of the scan chains 28 represented by dashed lines are used for realizing LBIST test engine, i.e. the PRPG 22, the weighting storage elements 24, the weighting and phaseshift logic 26, the masking storage elements 32, the masking logic 34 and the MISR 36.

The LBIST test engine runs on those parts of the logic circuits 30 represented by solid lines. Afterwards the LSSD engine may run on the remaining parts of the logic circuits 30 represented by dashed lines.

As an example of the invention, a logic macro instantiated many times on the chip is a suitable macro.

Figure 5:
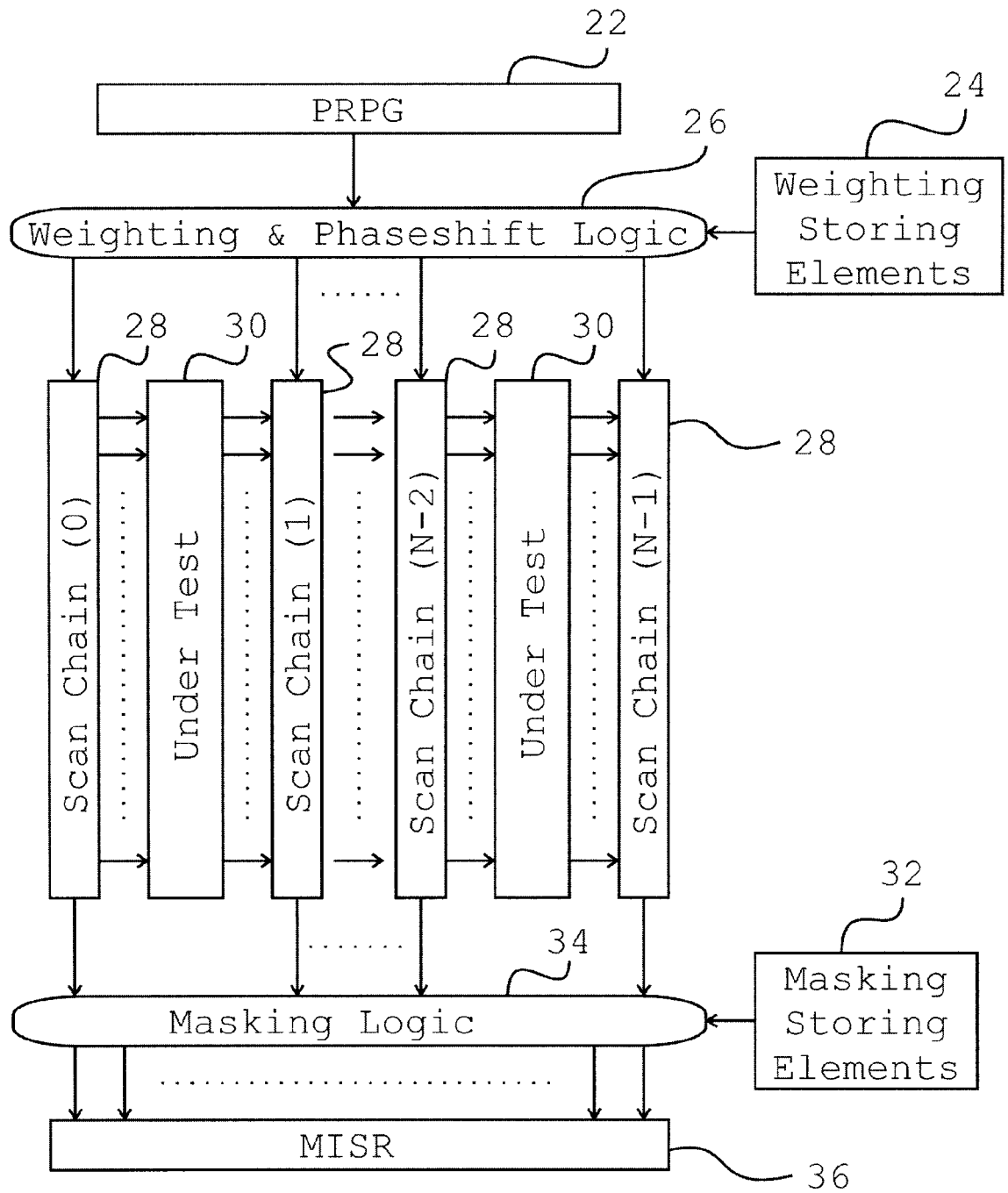
FIG. 5 illustrates a functional diagram of a logic built-in-self-test engine according to the prior art.

FIG. 5 illustrates a diagram of the integrated circuit with the LBIST engine according to the prior art. In this known LBIST engine the complete scan chains 28 are fed with random patterns. The LBIST test case is running on the complete logic circuit 30.

The comparison of FIG. 2 and FIG. 5 demonstrates the difference between the present invention and the prior art. According to the present invention a part of the scan chains 28 is used as the LBIST engines or a part of the LBIST engines. According to the present invention only a part of the logic circuit 30 is tested by the LBIST engine. The remaining part of said logic circuit 30, which is represented by the dashed line, may be tested by a LSSD engine, for example.

Figure 3:
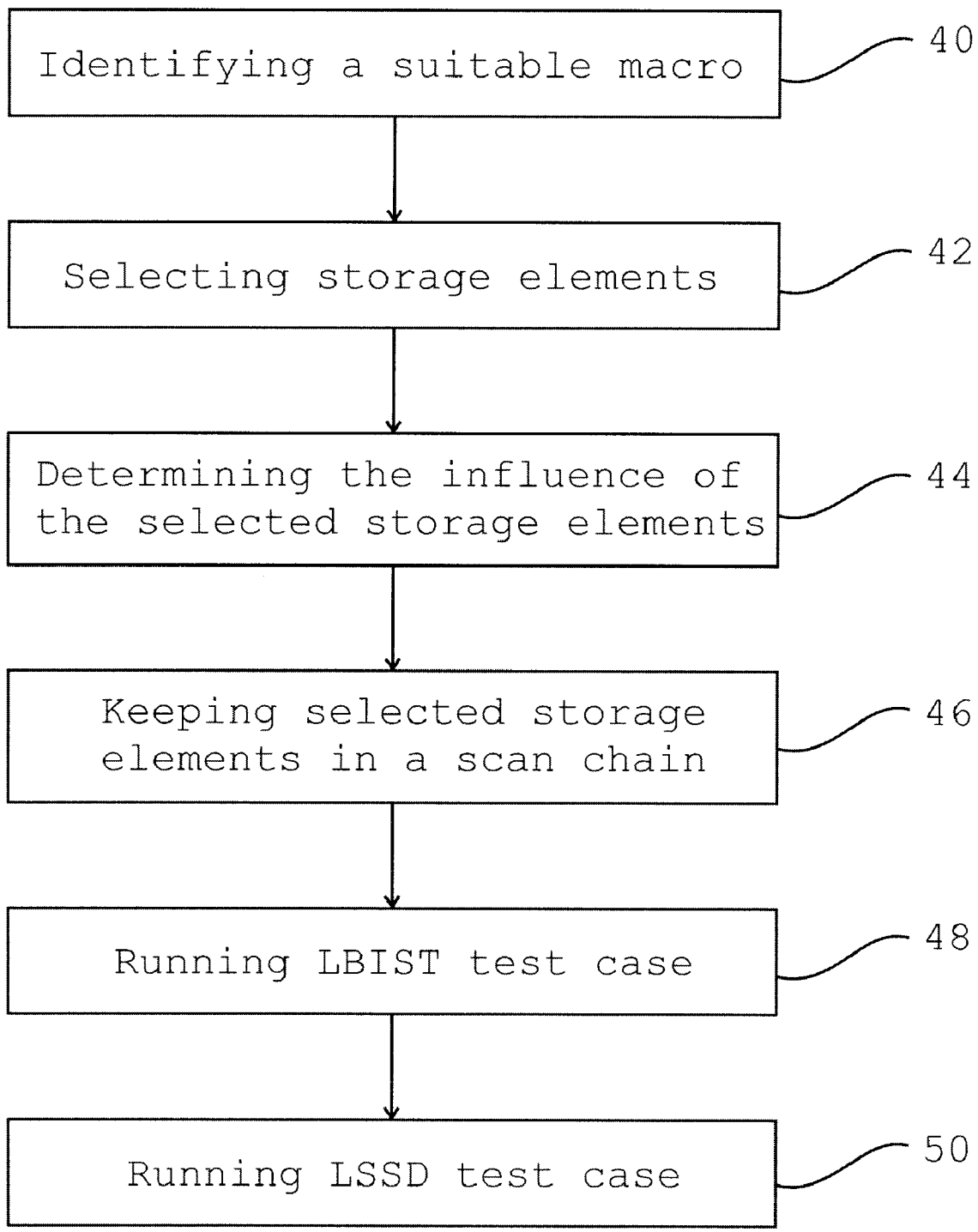
FIG. 3 illustrates a flow chart diagram of a method for specifying and testing the integrated circuit with the logic built-in-self-test engine according to the present invention.

FIG. 3 illustrates a flow chart diagram of a method for specifying the integrated circuit with the LBIST engine according to the present invention. Said method is provided for an integrated circuit with a given structure of storage elements and logical circuits.

In a first step 40 a suitable macro is identified. The macro is formed by storage elements and logic circuits, which are interconnected according to a predetermined scheme. The selection criteria for the suitable macro are chip-specific. For example, an important criterion may be that said macro is not a critical one. Another criterion may be that the macro is used for several times on the chip. Thereby the macro should be distributed in such a way that multiple LBIST engines can be built.

In a second step 42 the storage elements in the macro are selected for the reconfiguration. The number of the storage elements required for the functionality of the LBIST engine depends on the size the PRPG 22, the weighing storage elements 24, the masking storage elements 32, the masking logic 34 and the MISR 36. If the chosen macro has more storage elements than required, then there is a freedom of choice. The selection criteria for the storage elements are macro-specific. Preferably the scan-only storage elements shall rather be used for the functionality of the PRPG 22, since the scan-only storage elements do not change their values in the functional mode. Hence, there is no need to fence the output of those storage elements from going into the weighting and phaseshift logic 24. This again prevents unnecessary switching activities in order to reduce power consumption and comes for free. The use of scanable storage elements would require additional logic gates for fencing.

In a next step 44 the cone of influence for the selected storage elements is determined, which means that all the circuit elements influencing them in the same clock cycle are determined. The storage elements, which are used for the LBIST engine, are no longer a part of the scan chains driving the logic circuit 30 during the LBIST test case. The output of these storage elements can be optionally fenced to prevent them from driving that functional logic, which is being tested by the LBIST engine.

The selected storage elements are kept in a separate scan chain in a step 46. During the LBIST test case, the PRPG 22 usually needs to be scanned with a starting value. At the end the signature from the MISR 36 has to be scanned out of the chip. This procedure is repeated as often as the number of the available starting values in the PRPG 22. Preferably only storage elements with LBIST functionality are placed in a separate scan chain in order to reduce the scan time and consequently the test time.

The above steps 40, 42, 44 and 46 form the preferred embodiment of the inventive method for specifying the integrated circuit with the LBIST engine. The following steps relate to the test cases.

The LBIST test case is running in a further step 48. The selected storage elements operate as a part of the LBIST engine. The selected storage elements are not tested by the LBIST test case.

In a last step 50 a LSSD test case is running. The selected storage elements in the LBIST scan chains are now a part of the LSSD scan chains. The selected storage elements are tested by the LSSD test case.

The LSSD testable storage elements are connected to so-called LSSD scan chains. The LSSD scan chains are scanned with deterministic patterns by a LSSD engine. During the LSSD testcase no LBIST functionality is required. Hence, the selected storage elements in the steps above can now also be tested as other storage elements.

The present invention can also be embedded in a computer program product, which comprises all the features enabling the implementation of the methods described herein. Further, when loaded in computer system, said computer program product is able to carry out these methods.

Although illustrative embodiments of the present invention have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

List of Reference Numerals:
10 scan-able storage element
12 scan-only storage element
14 functional logic circuit 16 LBIST logic circuit
18 LBIST logic circuit
20 scan chain
22 pseudo-random pattern generator (PRPG)
24 weighting storing elements
26 weighting and phaseshift logic
28 scan chain
30 logic circuit
32 masking storing elements
34 masking logic
36 multiple input signature register (MISR)
40 step of identifying a suitable macro
42 step of selecting the storage elements
44 step of determining the cone of influence
46 step of keeping the storage elements in a scan chain
48 step of running the LBIST test case
50 step of running the LSSD test case
DI scan output
SI scan output
DO scan output
SO scan output
FC functional clock input
SC scan clock input
MC mixed clock input
L1 flip-flop
L2 flip-flop

The invention claimed is:

1. A method for testing an integrated circuit comprising a step of performing a test case with at least one logic built-in self-test (LBIST) engine on the integrated circuit with a plurality of storage elements and logic circuits interconnected according to a predetermined scheme, wherein:
the LBIST engine is partially formed by the storage elements and the logic circuits provided for functional purposes, at least one scan chain is formed by selected ones of the storage elements, keeping the non-selected storage elements to be used for the LBIST engine or a portion thereof in a testing mode, said at least one scan chain being driven by a test pattern, wherein the LBIST tests a subset of the logic circuits corresponding to the selected storage elements of said at least one scan chain, and wherein when in the testing mode, the LBIST engine runs with scan clocks enabled providing an LBIST test function, the same storage elements that form the LBIST engine being reused to create a new logical function when the integrated circuit is not in the testing mode and functional clocks are running, said new logical function being independent of said LBIST test function.

2. The method according to claim 1, wherein a first subset of the logic circuits is used for the LBIST engine or a portion thereof in the testing mode.

3. The method according to claim 1, wherein a second subset of the logic circuits is used for functional purposes in a functional mode.

4. The method according to claim 1, wherein a third subset of the storage elements is used for functional purposes in a functional mode.

5. The method according to claim 1, wherein the scan chain is driven by a random test pattern.

6. The method according to claim 1, wherein the test pattern is shifted by a phaseshift logic in the testing mode, wherein the logic circuits of said phaseshift logic is used for functional purposes in a functional mode.

7. The method according to claim 1, wherein the test pattern is weighted by a weighting logic in the testing mode, wherein the logic circuits of said weighting logic are used for functional purposes in a functional mode.

8. The method according to claim 7, wherein weighting criteria are stored in weighting storing elements during the testing mode, wherein the logic circuits of said weighting storing elements are used for functional purposes in a functional mode.

9. The method according to claim 1, wherein results from the scan chains are serially compressed into a register.

10. An integrated circuit (IC) formed by a plurality of storage elements and logic circuits interconnected according to a predetermined scheme and at least one logic built-in self-test (LBIST) engine, the IC including:
the LBIST engine having the storage elements and the logic circuits provided for functional purposes,
at least one scan chain formed by a first subset of the storage elements,
the LBIST engine or a portion thereof including a second subset of the storage elements in a testing mode, the at least one scan chain being connected to a pattern generator, and to a third subset of the logic circuits connected to the storage elements of said at least one scan chain, wherein when in the testing mode, the LBIST engine runs with scan clocks enabled providing an LBIST test function, the same storage elements that form the LBIST engine being reused to create a new logical function when the integrated circuit is not in the testing mode and functional clocks are running, said new logical function being independent of said LBIST test function.

11. The integrated circuit according to claim 10, wherein the LBIST engine or a portion thereof includes a fourth subset of the logic circuits in the testing mode.

12. The integrated circuit according to claim 10, wherein the third subset of the logic circuits are provided for functional purposes in a functional mode.

13. The integrated circuit according to claim 10, wherein the second subset of the storage elements are provided for functional purposes in the functional mode.

14. The integrated circuit according to claim 10, wherein each one of the storage elements comprises a scan input (SI) and a scan output (SO), wherein the storage elements are serially connected via the scan inputs (SI) and scan outputs (SO).

15. The integrated circuit according to claim 10, wherein the second subset of the logic circuits is coupled to a level sensitive scan design (LSSD) engine.

16. The integrated circuit according to claim 10, wherein remaining storage elements are coupled to a level sensitive scan design (LSSD) engine.

* * * * *